(12) United States Patent
Henninger et al.

(10) Patent No.: US 6,927,101 B2
(45) Date of Patent: Aug. 9, 2005

(54) FIELD-EFFECT-CONTROLLABLE SEMICONDUCTOR COMPONENT AND METHOD FOR FABRICATING THE COMPONENT

(75) Inventors: Ralf Henninger, München (DE); Franz Hirler, Isen (DE); Martin Pölzl, Ossiach (AT); Walter Rieger, Arnoldstein (AT)

(73) Assignee: Infineon Technologies AG, Munich (DE)

( * ) Notice: Subject to any disclaimer, the term of this patent is extended or adjusted under 35 U.S.C. 154(b) by 169 days.

(21) Appl. No.: 10/402,812

(22) Filed: Mar. 28, 2003

(65) Prior Publication Data

US 2003/0186507 A1 Oct. 2, 2003

(30) Foreign Application Priority Data

Mar. 28, 2002 (DE) ......................................... 102 14 175

(51) Int. Cl.[7] ............................................ H01L 21/332
(52) U.S. Cl. ........................ 438/135; 438/138; 438/139
(58) Field of Search .................................. 438/135, 138, 438/139

(56) References Cited

U.S. PATENT DOCUMENTS

| 6,051,468 A | 4/2000 | Hshieh |
| 6,624,469 B1 | 9/2003 | Harada |
| 2003/0214011 A1 * | 11/2003 | Jianjun et al. .............. 257/500 |

* cited by examiner

*Primary Examiner*—Caridad Everhart
(74) *Attorney, Agent, or Firm*—Lawrence A. Greenberg; Werner H. Stemer; Ralph E. Locher

(57) ABSTRACT

A method for fabricating a field-effect-controllable semiconductor component includes providing a configuration having a semiconductor body with a front side, a rear side, a first terminal zone of a first conduction type, a channel zone of a second conduction type formed above the first terminal zone, and at least one control electrode adjacent the channel zone. The control electrode is insulated from the semiconductor body. A second terminal zone of the first conduction type is fabricated in the channel zone near the front side of the semiconductor body by: doping the channel zone near the front side with a first dopant concentration to fabricate a first zone of the first conduction type, and doping a section of the first zone with a second dopant concentration higher than the first dopant concentration to form a second zone of the first conduction type.

24 Claims, 10 Drawing Sheets

FIELD-EFFECT-CONTROLLABLE SEMICONDUCTOR COMPONENT AND METHOD FOR FABRICATING THE COMPONENT

BACKGROUND OF THE INVENTION

Field of the Invention

The present invention relates to a method for fabricating a field-effect-controllable semiconductor component having a first terminal zone and a second terminal zone of a first conduction type, a channel zone arranged between the first terminal zone and the second terminal zone, and a control electrode, which is formed in a manner insulated from the terminal and channel zones and runs in the vertical direction. The terminal zones are contact-connected by using electrodes. In a MOSFET (Metal Oxide Semiconductor Field Effect Transistor), the first terminal zone is usually referred to as the drain zone, the second terminal zone is usually referred to as the source zone, the channel zone is usually referred to the as body zone and the control electrode is usually referred to the as gate electrode. Such components with a component arranged in a trench are also referred to as trench transistors.

The invention relates, in particular, to the fabrication of the source zone in such a way that a low-resistance contact is formed between the terminal zone and the associated terminal electrode. The second terminal zone is usually fabricated by redoping the channel zone in the region of the front side of the semiconductor body. In order to fabricate a low-resistance contact between a later electrode and the second terminal zone, the second terminal zone is highly doped, that is to say, by way of example, high doses of dopants of the second conduction type are implanted. In trench transistors, the following problem can occur in this case:

A high dopant concentration also ensues in the semiconductor region directly adjacent to the insulation layer of the gate electrode. A section of the body zone along the insulation layer, which section remains after this doping, serves for forming a conductive channel between the source zone and the drain zone when a drive potential is applied. The length of this channel running in the vertical direction—and hence the parameters which are relevant to the switching behavior and the breakdown behavior, such as, for example, the breakdown voltage and the threshold voltage—are determined by the penetration depth of the dopant atoms in the vertical direction during the method for fabricating the source zone. In known methods, the entire front side of the semiconductor body is exposed to the implantation process. Since the gate electrode usually ends below the surface of the semiconductor body, or is etched back correspondingly, dopant atoms can be scattered via the cutout above the gate electrode through the insulation layer into the body zone and can shorten the available channel region.

A remedy may be provided by reducing the implantation dose or the implantation energy, although this increases the contact resistance between a later source electrode and the source zone.

SUMMARY OF THE INVENTION

It is accordingly an object of the invention to provide a method for fabricating a field-effect-controllable semiconductor component, which overcomes the above-mentioned disadvantages of the prior art methods of this general type.

In particular, it is an object of the invention to provide a method for fabricating a field-effect-controllable semiconductor component in which a low-resistance contact between a terminal zone of a semiconductor body and an electrode can be realized in a simple manner without adversely affecting the channel length.

With the foregoing and other objects in view there is provided, in accordance with the invention, a method for fabricating a field-effect-controllable semiconductor component. The method includes providing a configuration having a semiconductor body with a front side, a rear side, a first terminal zone of a first conduction type, a channel zone of a second conduction type formed above the first terminal zone, and at least one control electrode adjacent the channel zone. The control electrode is insulated from the semiconductor body. A second terminal zone of the first conduction type is fabricated in the channel zone near the front side of the semiconductor body by: doping the channel zone near the front side with a first dopant concentration to fabricate a first zone of the first conduction type, and doping a section of the first zone with a second dopant concentration higher than the first dopant concentration to form a second zone of the first conduction type.

In accordance with an added feature of the invention, before performing the step of doping the section of the first zone, a mask is produced above the front side of the semiconductor body such that the mask has a cutout above the first doped zone and covers the control electrode.

In accordance with an additional feature of the invention, the method includes: providing the mask as an insulation layer wherein the cutout is formed in the insulation layer and is located above the channel zone; and after performing the step of doping the section of the first zone, leaving the mask on the semiconductor body.

In accordance with another feature of the invention, the method includes performing the step of doping the section of the first zone to produce a heavily doped zone of the first conduction type in the first zone below edges of the cutout.

In accordance with a further feature of the invention, the method includes performing the step of doping the section of the first zone by carrying out an implantation method in which implantation is effected at a first angle and at a second angle with respect to a normal to the semiconductor body.

In accordance with a further added feature of the invention, the method includes before performing the implantation method, producing a trench only reaching down into the first zone.

In accordance with a further additional feature of the invention, the method includes: providing a thin first insulation layer on the front side of the semiconductor body; and providing the insulation layer on the thin first insulation layer.

In accordance with another further feature of the invention, the method includes: forming the cutout through the insulation layer to the first insulation layer on the front side of the semiconductor body; and performing the implantation method through the first insulation layer into the first terminal zone.

In accordance with yet an added feature of the invention, the method includes: before performing the step of doping the section of the first zone, producing a mask above the front side of the semiconductor body such that the mask has a cutout above the first doped zone and covers the control electrode; and after performing the step of doping the section of the first zone, removing the mask.

In accordance with yet an additional feature of the invention, the mask is a photomask.

In accordance with yet another feature of the invention, the method includes: fabricating a contact hole reaching from the front side of the semiconductor body through the first terminal zone and down into the channel zone; and fabricating a terminal electrode in the contact hole.

In accordance with yet a further feature of the invention, the method includes: before performing the step of doping the section of the first zone, producing a mask above the front side of the semiconductor body such that the mask has a cutout above the first doped zone and covers the control electrode; providing the mask as an insulation layer wherein the cutout is formed in the insulation layer and is located above the channel zone; after performing the step of doping the section of the first zone, leaving the mask on the semiconductor body; and when performing the step of fabricating the contact hole, using the insulation layer having the cutout as a mask.

In accordance with yet a further added feature of the invention, the step of fabricating the terminal electrode includes depositing an electrode layer onto the insulation layer and into the contact hole.

In accordance with an added feature of the invention, the method includes, after performing the step of fabricating the contact hole, producing a heavily doped zone of the second conduction type in the channel zone at a bottom of the contact hole.

In accordance with an additional feature of the invention, the method includes performing the step of producing the heavily doped zone by carrying out an implantation method at an angle of 0° with respect to a normal to the semiconductor body.

In accordance with another feature of the invention, the method includes performing the step of fabricating the contact hole using an anisotropic etching method.

In accordance with a further feature of the invention, the method includes: using an implantation method to perform the step of fabricating the contact hole; and using an implantation method to perform the step of doping the channel zone with a dose of about $\frac{1}{20}$ of that used during the step of fabricating the contact hole.

In accordance with a further added feature of the invention, the method includes, before performing the step of doping the section of the first zone, producing a mask above the front side of the semiconductor body such that the mask has a cutout above the first doped zone and covers the control electrode; and before performing the step of doping the section of the first zone, producing a trench in the first zone, filling the trench with a material containing dopant atoms, and subsequently driving out the dopant atoms using a diffusion method.

In accordance with a further additional feature of the invention, the method includes performing the step of producing the trench such that the trench reaches down into the channel zone and serves as a contact hole; and applying a diffusion barrier to a bottom of the contact hole.

In accordance with another additional feature of the invention, the method includes fabricating an electrode in the contact hole.

In accordance with yet an added feature of the invention, the material containing the dopant atoms forms a part of the electrode.

In accordance with yet an additional feature of the invention, material containing the dopant atoms is highly doped polysilicon.

In accordance with yet a further feature of the invention, the material containing the dopant atoms is an arsenic glass.

With the foregoing and other objects in view there is also provided, in accordance with the invention, a field-effect-controllable semiconductor component including: a first terminal zone of a first conduction type; a second terminal zone of a first conduction type; a channel zone of a second conduction type, the channel zone configured between the first terminal zone and the second terminal zone; a control electrode configured adjacent the channel zone and being insulated from the channel zone; and a terminal electrode connected at least to the second terminal zone. The second terminal zone has a doped first zone and a zone connected to the terminal electrode. The zone that is connected to the terminal electrode is doped more heavily than the first zone.

The method first provides a configuration having a semiconductor body, which has a front side, a rear side, a first terminal zone of a first conduction type, a channel zone of a second conduction type formed above the first terminal zone, and at least one control electrode arranged in a manner insulated from the semiconductor body and adjacent to the channel zone and extending in the vertical direction into the semiconductor body. Afterward, a second terminal zone of the first conduction type is fabricated in the channel zone in the region of the front side of the semiconductor body. In the method, the fabrication of the second terminal zone provides for the doping of the channel zone in the region of the front side with a first dopant concentration in order to fabricate a zone of the first conduction type, and subsequently for the doping of a section of the doped zone with a dopant concentration which is higher than the first dopant concentration.

In the method, the second terminal zone, the source zone in a MOSFET, is fabricated in two stages. The doped zone that is fabricated first of all forms the source zone in particular in the region along the gate electrode. This zone is preferably fabricated using an implantation method, and the implantation dose is chosen such that no or hardly any dopant atoms pass through the insulation layer of the gate electrode into the semiconductor body. A low-resistance contact is ensured by the subsequent second doping step.

In one embodiment of the method, before the second doping step is carried out, a mask is produced above the front side of the semiconductor body. This mask covers the control electrode, the gate electrode in a MOSFET, in order to prevent the channel from being shortened.

One embodiment of the method provides for the mask to be an insulation layer having a cutout above the previously produced first zone. The cutout is produced, for example, using an etching method. A mask that prescribes the position and dimensions of the cutout that is to be produced is applied to the insulation layer. The insulation layer remains after the second doping step on the semiconductor body and then serves both as a mask for the fabrication of a contact hole reaching down into the channel zone in the semiconductor body and for the insulation of a source electrode fabricated in the contact hole and on the top side of the insulation layer from the semiconductor body.

In order to prevent a complete removal of the heavily doped region—fabricated by the second doping method—of the first conduction type in the semiconductor body below the cutout of the insulation layer, one embodiment uses a doping method which effects doping under the edges of the cutout. This heavily doped zone is then produced both below a bottom region of the contact hole, in the insulation layer and laterally below the edges of the cutout in the more weakly doped zone previously fabricated.

The regions of the heavily doped zone which are formed below the edges of the cutout of the insulation layer are preserved during the fabrication of the contact hole in the semiconductor body and serve, after the fabrication of an electrode in the contact hole, as low-resistance contact between the electrode and the second terminal zone, which forms the source zone in a MOSFET.

In a MOSFET, moreover, the channel zone forms the body zone and the first terminal forms the drain zone. The electrode in the contact hole of the semiconductor body, which reaches through the source zone right into the body zone, short-circuits the source zone and the body zone in order to largely eliminate a parasitic bipolar transistor formed by the sequence of the source zone, the body zone and the drain zone.

Preferably, before the fabrication of the electrode, a heavily doped region of the second conduction type is produced in the body zone in order to achieve a low-resistance terminal contact between the electrode and the body zone.

The doping method which forms a heavily doped terminal region in the source region that passes under the edges of the contact hole in the insulation layer is preferably an implantation method in which implantation is effected at a first and a second angle with respect to the normal to the semiconductor body. The contact hole in the insulation layer preferably widens toward the top in order not to obstruct the oblique implantation.

In a further embodiment of the method, the mask applied before the second doping step is removed after the doping step has been carried out. In this method, too, an electrode is preferably produced in a contact hole. This electrode reaches through the heavily doped zone—fabricated using the second doping method—of the source zone right into the body zone and short-circuits the source zone and the body zone.

In a further embodiment of the invention, the heavily doped zone required for the fabrication of a low-resistance contact in the source zone is fabricated by using a diffusion method. For this purpose, after the first doping step, a trench is produced at least in the doped zone fabricated by using the first doping step and is filled with a material containing dopant atoms. The dopant atoms are subsequently outdiffused by a thermal process.

The trench for the diffusion process may simultaneously serve as a contact hole for the source electrode and can reach right into the body zone. In this case, the bottom of the contact hole is covered with a diffusion barrier before the diffusion process. The diffusion barrier prevents an outdiffusion into the body zone. The material containing the outdiffusing dopant atoms may already form a part of the later source electrode and include highly doped polysilicon, for example.

The material containing dopant atoms may also be removed after the diffusion process and before the fabrication of the source electrode and may include an arsenic glass, for example, if the source zone is n-doped.

Other features which are considered as characteristic for the invention are set forth in the appended claims.

Although the invention is illustrated and described herein as embodied in a field-effect-controllable semiconductor component and method for fabricating the component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
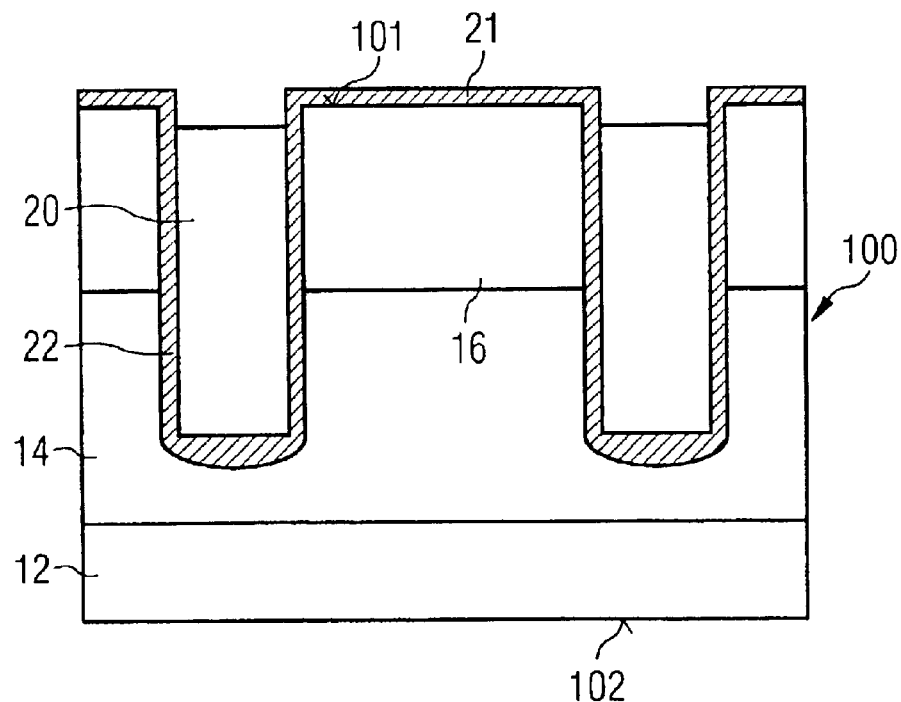
FIG. 1A is a view of a configuration having a semiconductor body, a first terminal zone, a channel zone arranged above the first terminal zone, and a control electrode extending in the vertical direction into the semiconductor body and arranged in a trench.

Referring now to the figures of the drawing in detail and first, particularly, to FIG. 1A thereof, there is shown a configuration having a semiconductor body 100 and a control electrode 20, which is arranged in a manner insulated from the semiconductor body 100 in a trench extending in the vertical direction into the semiconductor body. The semiconductor body includes a first terminal zone 12, 14 and a channel zone. The later body zone of the MOSFET is arranged above the first terminal zone 12, 14. The first terminal zone 12, 14 includes a heavily doped semiconductor zone 12, which is the drain zone of the MOSFET, and a more weakly doped semiconductor zone 14, which is the drift zone of the MOSFET.

The drain zone 12 may be formed, for example, by a heavily doped semiconductor substrate to which a more weakly doped epitaxial layer is applied. The semiconductor body may also be formed by a wafer ground thin whose rear side is heavily doped in order to form the drain zone.

The trench in which the gate electrode 20 is formed extends into the body zone 16 proceeding from the front side 101 of the semiconductor body and ends above the drain zone 12.

The configuration in accordance with FIG. 1A can be fabricated by using customary semiconductor technology methods; the method steps required for this shall only be outlined briefly. In this case, by way of example, first of all a semiconductor substrate is fabricated, to which an epitaxial layer is applied. The epitaxial layer is doped in the region of the body zone 16 by using suitable methods, for example, by using implantation methods, in order to achieve a desired dopant concentration. Afterward, the trench or trenches for the later gate electrodes 20 is or are fabricated for example, by using etching methods. The fabrication of these trenches is followed by the fabrication of an insulation layer 22 in the region of the trenches. This insulation layer insulates the later gate electrode 20 from the semiconductor body 100. The insulation layer 22 is fabricated, for example, by using a thermal oxidation, so that an insulation layer 21 is also produced in the region of the front side 101 of the semiconductor body. It goes without saying that the gate insulation layer 21 can also be of a multilayer construction.

The gate electrode 20 is subsequently produced; it includes polysilicon, for example, when silicon is used as semiconductor material for the semiconductor body 100. The gate electrode usually is etched back to below the surface of the semiconductor body 100, so that a cutout is produced in the trench above the gate electrode 20.

In an embodiment that is not specifically illustrated, the gate electrode undergoes transition into a field plate at its lower end facing the drift zone 14. For this purpose, the gate electrode tapers in a known manner in the region of the drift zone 14 in the lateral direction. The thickness of the insulation layer 22 increases correspondingly. Furthermore, more than one electrode may be arranged in the trench in a manner insulated from the semiconductor body.

The drain zone 12 is of a first conduction type, while the body zone 16 is of a second conduction type complementary to the first conduction type. In an n-channel MOSFET, the drain zone 12 is n-doped, while the body zone 16 is p-doped.

Figure 1B:
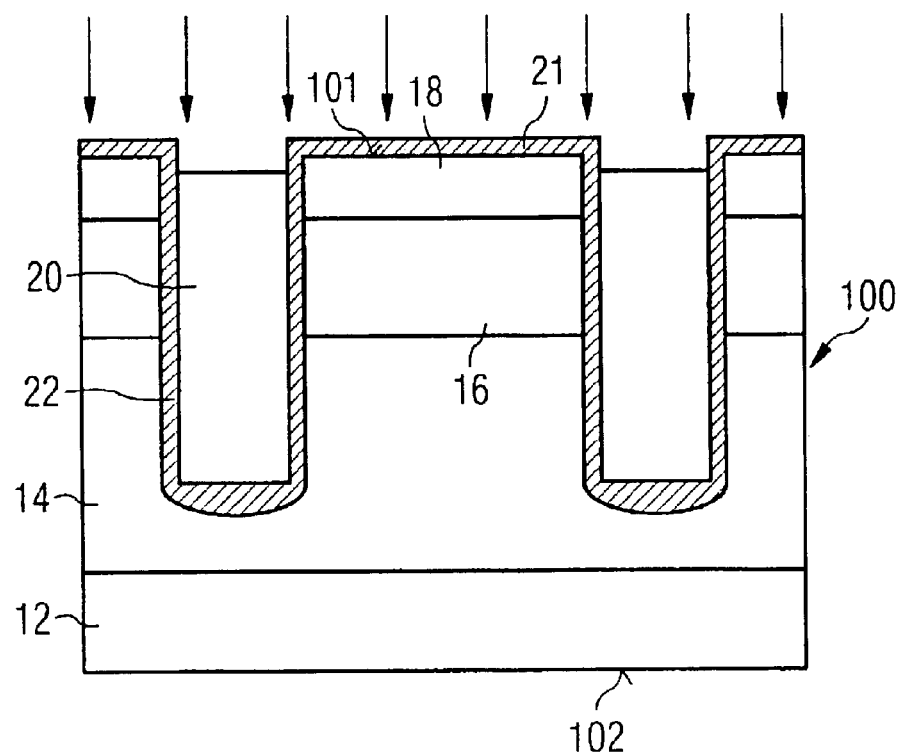
FIG. 1B is a view of the configuration shown in FIG. 1A during a first method step for fabricating a doped first zone of the second terminal zone above the channel zone.

FIG. 1B is a view of the configuration shown in FIG. 1A during a first doping step, for example, an implantation method, in which the body zone 16 is redoped in the region of the front side 101 of the semiconductor body 100 in order to form a first doped zone 18. The first doped zone 18 forms a part of the later source zone of the MOSFET. Dopant atoms of the first conduction type are introduced by doping during the doping step. The dose during the implantation method is chosen such that no dopant atoms are scattered from above the cutout above the gate electrode through the insulation layer 21 into the body zone in order thereby to influence the length of the remaining body zone, and thus the channel length.

Figure 1C:
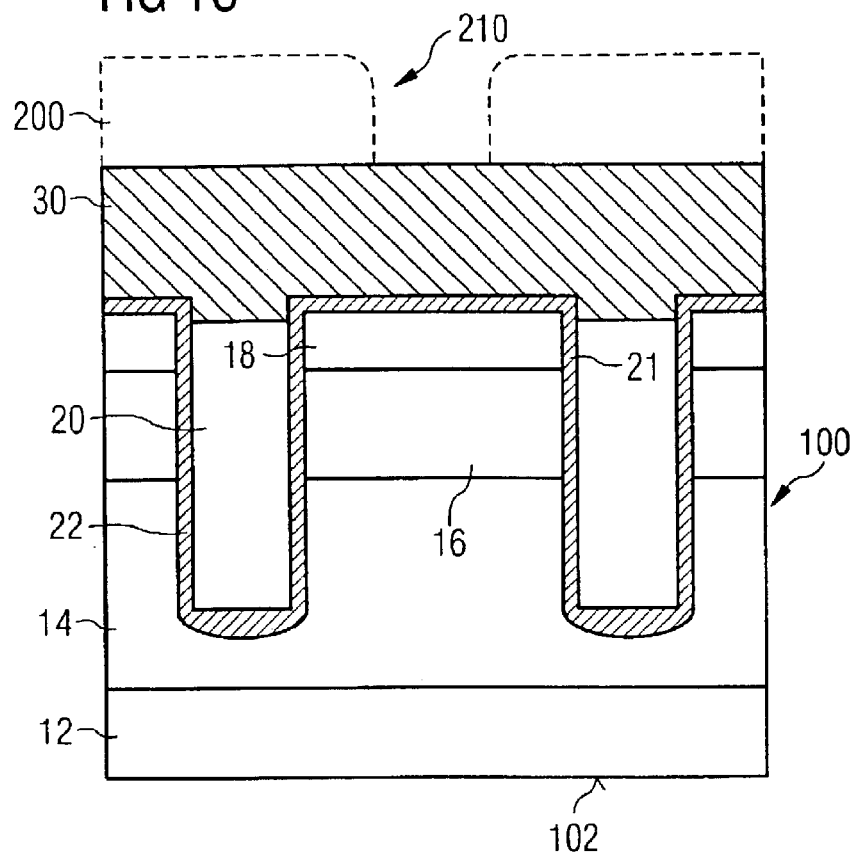
FIG. 1C is a view of the configuration shown in FIG. 1B after a method step in which an insulation layer was deposited onto the configuration.

FIG. 1C is a view of the configuration shown in FIG. 1B after further method steps in which an insulation layer 30 was deposited above the front side of the semiconductor body 100 and above the gate electrode 20. The insulation layer 30 includes a deposited oxide, for example.

Figure 1D:
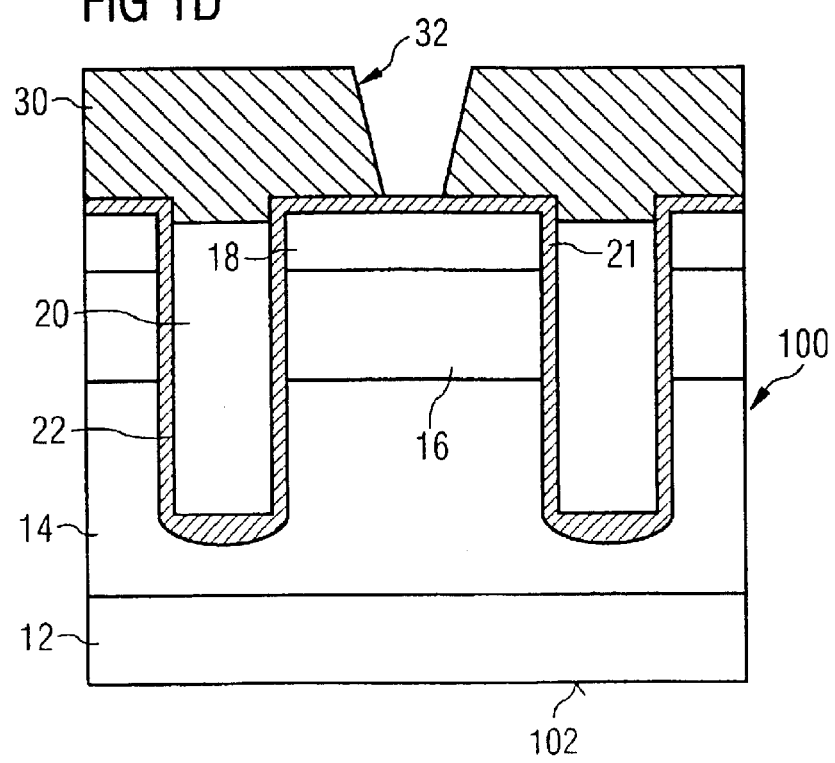
FIG. 1D is a view of the configuration shown in FIG. 1C after the fabrication of a cutout in the insulation layer.

In the next method steps, the result of which is illustrated in FIG. 1D, a cutout 32 is produced in the insulation layer 30 above the first zone 18. The cutout 32 is fabricated for example by using an etching method. A mask 200 suitable for such an etching method is illustrated by broken lines in FIG. 1C. The mask 200 has a cutout 210 that prescribes the dimensions of the cutout 32.

Figure 1E:
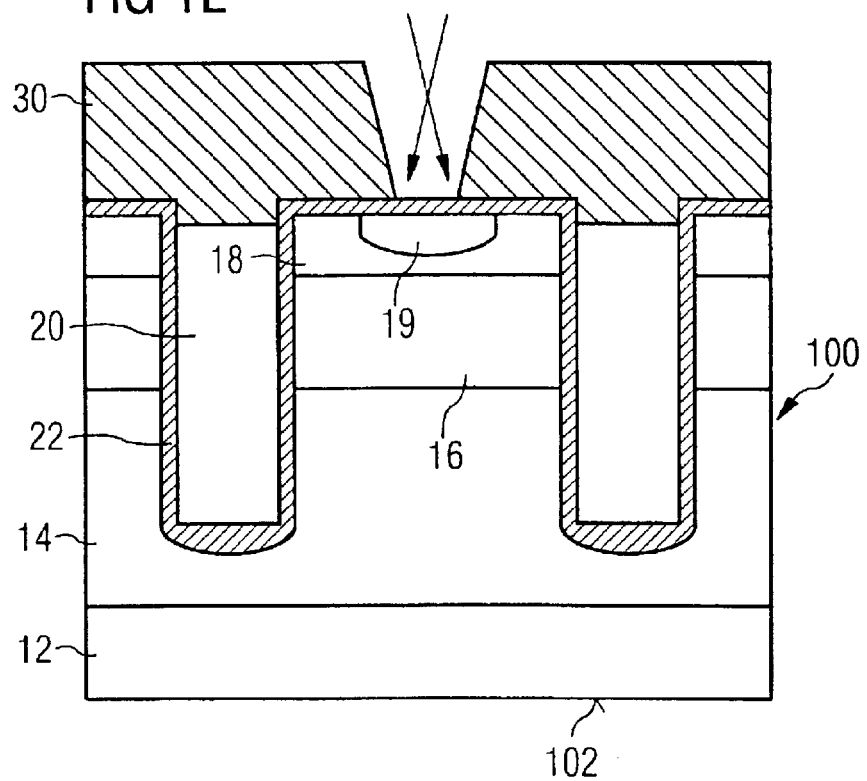
FIG. 1E is a view of the configuration shown in FIG. 1D during a second doping method.

The fabrication of the cutout 32 in the insulation layer 30 is followed by an implantation method, as is illustrated in FIG. 1E. The implantation is effected at least at a first angle $\alpha 1$ and a second angle $\alpha 2$ with respect to the normal to the semiconductor body 100, in order both to effect doping below the bottom of the cutout 32 into the first zone 18, and to effect doping under the lateral edges of the cutout 32 in the insulation layer 30.

In the methods illustrated in the figures, the cutout 32 is fabricated in such a way that the insulation layer 21 remains above the semiconductor body 100, and the implantation is effected through the thin insulation layer 21. Furthermore, the cutout 32 is preferably fabricated with inclined side walls, so that the dimensions of the contact hole 32 widen toward the top in order thus to facilitate an inclined implantation under the edges of the insulation layer 30 in the cutout 32.

The result of this implantation step is a heavily doped second zone 19 in the first zone 18. The implanted ions are chosen such that the heavily doped zone 19 is of the same conduction type as the first zone 18; arsenic, for example, is implanted in the case of an n-type doping. The heavily doped zone 19 reaches laterally under the edges of the insulation layer 30 in the region of the contact hole 32.

The more weakly doped first zone 18 and the heavily doped second zone 19 together form the source zone of the MOSFET.

Figure 1F:
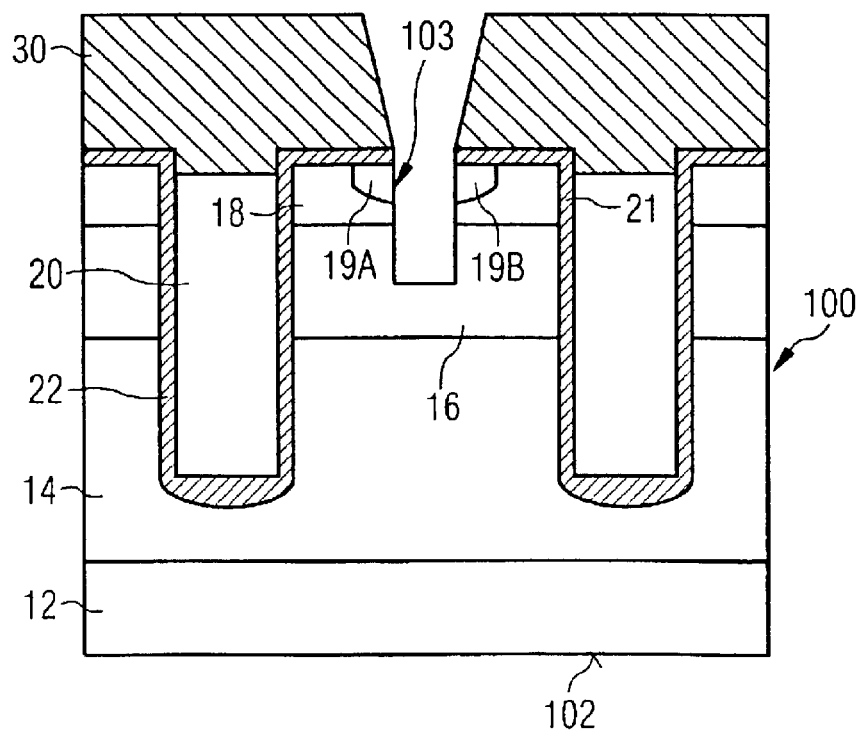
FIG. 1F is a view of the configuration shown in FIG. 1E after the fabrication of a contact hole in the semiconductor body.

FIG. 1F is a view of the configuration shown in FIG. 1E after a further method step in which a contact hole 103, fashioned in particular in the form of a trench, was produced in the semiconductor body 100. The contact hole 103 reaches through the first zone 18 right into the body zone 16. The insulation layer 30 with the contact hole 32 (FIG. 1D) serves as a mask for the fabrication of the contact hole 103 that is effected by using an etching method, for example. The etching method used is preferably an anisotropic etching method. A contact hole is produced whose dimensions in the lateral direction of the semiconductor body 100 correspond to the dimensions of the contact hole 32 in the insulation layer 30 in the lower region thereof. During the fabrication of the contact hole 103, parts of the heavily doped second zone 19 are removed, but the regions 19A, 19B of the heavily doped zone which are arranged below the edges of the insulation layer 30 in the region of the contact hole 32 remain. The regions 19A, 19B later serve as a low-resistance contact between an electrode and the first zone 18 (source zone), as will be explained.

Figure 1G:
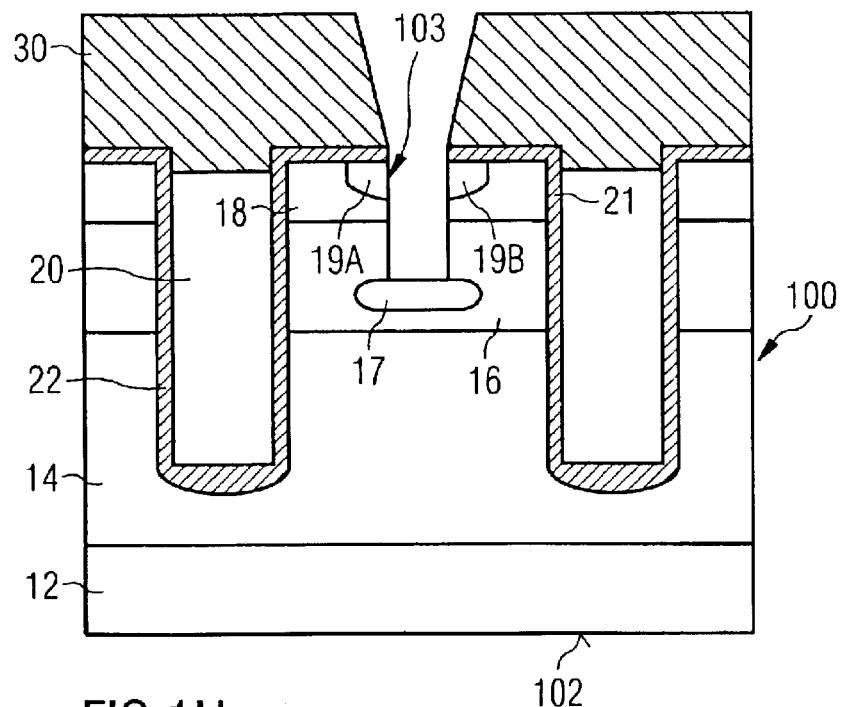
FIG. 1G is a view of the configuration shown in FIG. 1F after the fabrication of a heavily doped terminal zone in the channel zone.

FIG. 1G is a view of the configuration shown in FIG. 1F after further method steps in which a heavily doped zone 17 of the same conduction type as the body zone 16 was produced at the bottom of the contact hole 103 in the body zone 16. The heavily doped zone 17 is fabricated for example by using a so-called 0° implantation, during which dopants are implanted perpendicularly from above.

Figure 1H:
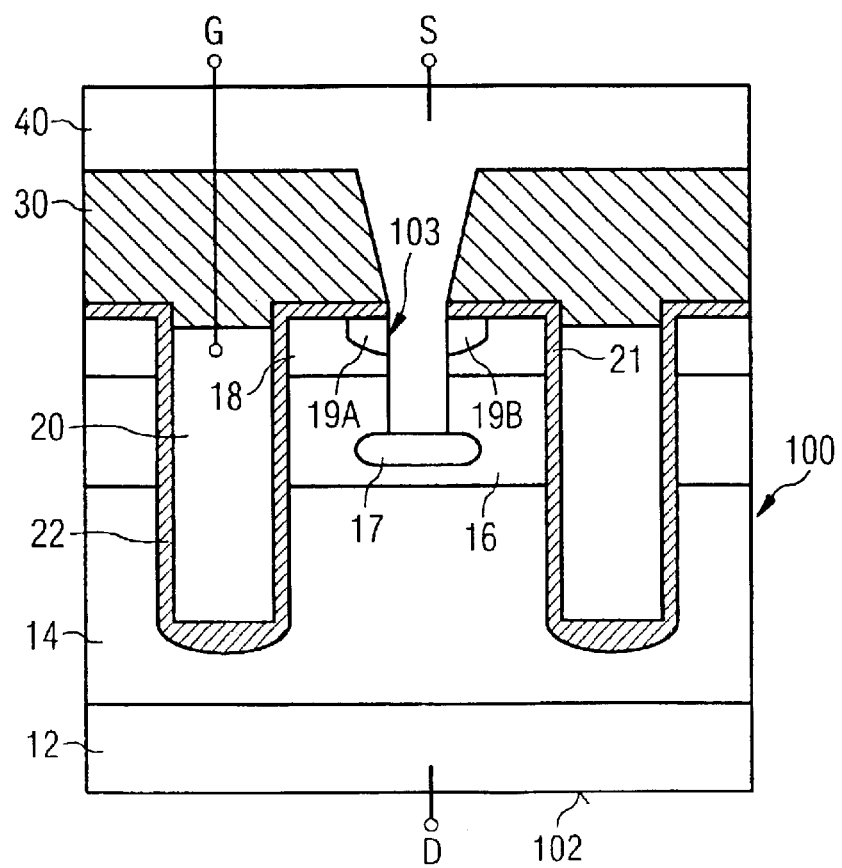
FIG. 1H is a view of the configuration shown in FIG. 1G after the fabrication of a terminal electrode.

FIG. 1H is a view of the configuration shown in FIG. 1G after next method steps in which an electrode layer 40 was deposited, which serves as the source electrode S of the MOSFET. The source electrode makes contact with the heavily doped regions 19A, 19B at side walls of the contact hole 103, so that there is a low-resistance contact between the electrode 40 and the first zone 18 (source zone). The source electrode 40 furthermore makes contact with the body zone 16 and the heavily doped zone 17 in the body zone 16. The heavily doped zone 17 ensures a low-resistance contact between the source electrode 40 and the body zone 16. The source electrode 40 short-circuits the first zone 18 and the body zone 16 and thus realizes the sufficiently known freewheeling diode in a MOSFET. The semiconductor substrate 12 forms the drain terminal of the MOSFET and the gate electrode 20 forms the gate terminal.

The method illustrated in FIGS. 1A–1H, in which the fabrication of a heavily doped zone in order to realize a low-resistance contact in the source zone is effected using an insulation layer 30 that is necessary anyway as mask, makes it possible to realize the heavily doped zone in a manner spaced apart from the trench with the gate electrode, so that the disadvantages present in the prior art cannot occur.

In a modification of the method illustrated in FIGS. 1A–1H, the trench is formed completely or partially as early as before the implantation step, in order then to effect inclined implantation into the doped zone 18 via the side walls of the trench. If the trench reaches down into the body zone 16, which can also lead to a doping of the body zone with charge carriers of the first conduction type during the tilt implantation, a heavily doped zone of the second conduction type is preferably produced at the bottom of the contact hole 103 before the fabrication of the source electrode, in order to connect the later source electrode to the body zone 16. Moreover, the insulation layer 32 shades the lower regions of the trench 103 during an inclined implantation, however, so that the essential implantation region is situated in the region of the first zone 18.

As an alternative, the contact hole first only reaches down into the first zone 18 and is driven down into the body zone 16 after the implantation step and before the fabrication of the source electrode 40.

It goes without saying that the method is not restricted to the fabrication of so-called trench MOSFETs, in which the gate electrode is arranged in a trench. Rather, the method can also be applied to the fabrication of MOSFETs in which the gate electrode is formed above the semiconductor body in the insulation layer. In these MOSFETs as well, a contact hole is produced in the insulation layer above the semiconductor body in order to be able to make low-resistance contact with the source zone.

Figure 2A:
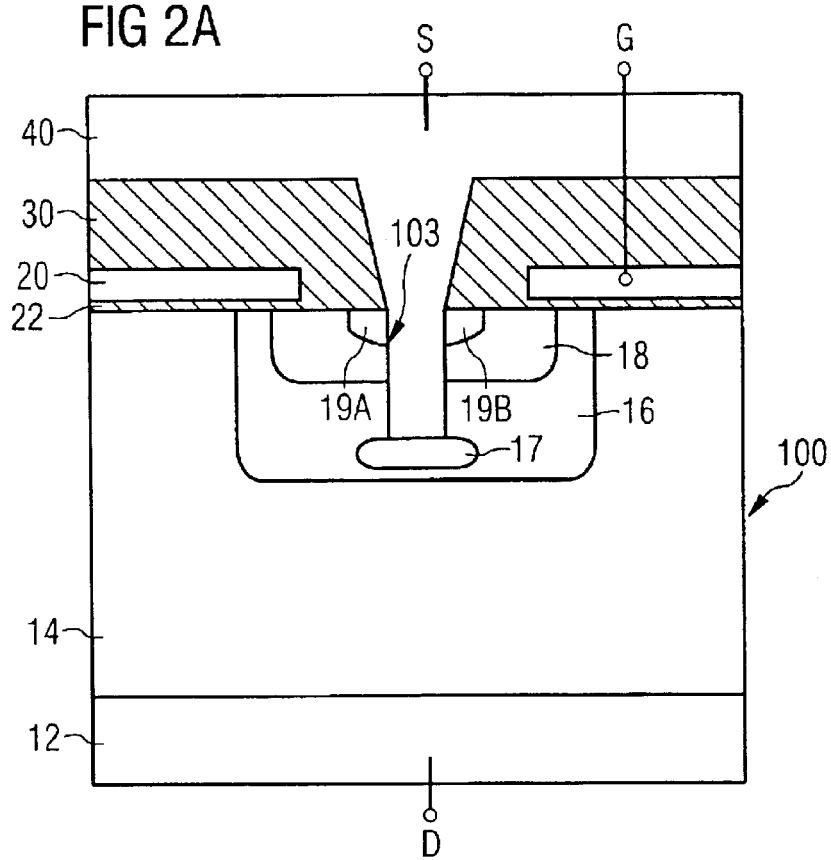
FIG. 2A is a view of a further semiconductor component fabricated using the inventive method.

FIG. 2A shows a semiconductor component that is fabricated using the inventive method and in which the gate electrode 20 is arranged above the semiconductor body 100 in the insulation layer 30.

Figure 2B:
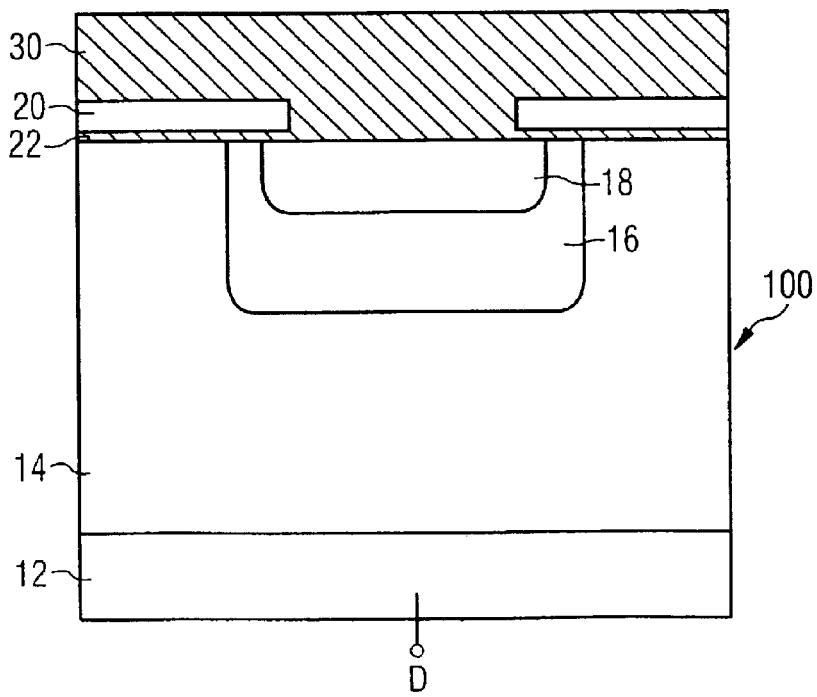
FIG. 2B is a view of the semiconductor component shown in FIG. 2A during a method step of the fabrication.

The starting point of the fabrication method for this semiconductor component illustrated in FIG. 2A is formed by the configuration illustrated in FIG. 2B, having a semiconductor body 100, which has a body zone 16 doped complementarily to the semiconductor body in the region of the front side of the semiconductor body 100. The source zone 18 is formed in the body zone. The gate electrode is formed above the front side of the semiconductor body 100 in an insulation layer 30. The gate electrode 20 has a cutout in a region above the source zone 18. A further exemplary embodiment of a method for fabricating a source zone 18, 19 of a MOSFET is explained below with reference to FIGS. 3A–3F.

The starting point of the method is formed, as also in the case of the method explained with reference to FIGS. 1A–1H, by a configuration having a semiconductor body 100, which has a drain zone 12, 14 or a drain zone 12 and a drift zone 14, a body zone 16 arranged above the drift zone 14, and at least one gate electrode 20, which extends into the semiconductor body proceeding from the front side and is insulated from the semiconductor body 100. In the exemplary embodiment in accordance with FIGS. 3A–3F, a further insulation layer 22 is applied to this configuration above the front side 101 and to the gate electrode 20. The insulation layer is, for example, a nitrite or a deposited oxide, in particular TEOS. During processes in which the semiconductor body is heated, for example, during diffusion processes, the layer 22 prevents dopants from being expelled from the gate electrode 20, which usually includes a highly doped polysilicon, and from contaminating other semiconductor regions. Such a protective layer 22 may also be present in the case of the method shown in FIGS. 1A–1H, but is not depicted explicitly there.

Figure 3A:
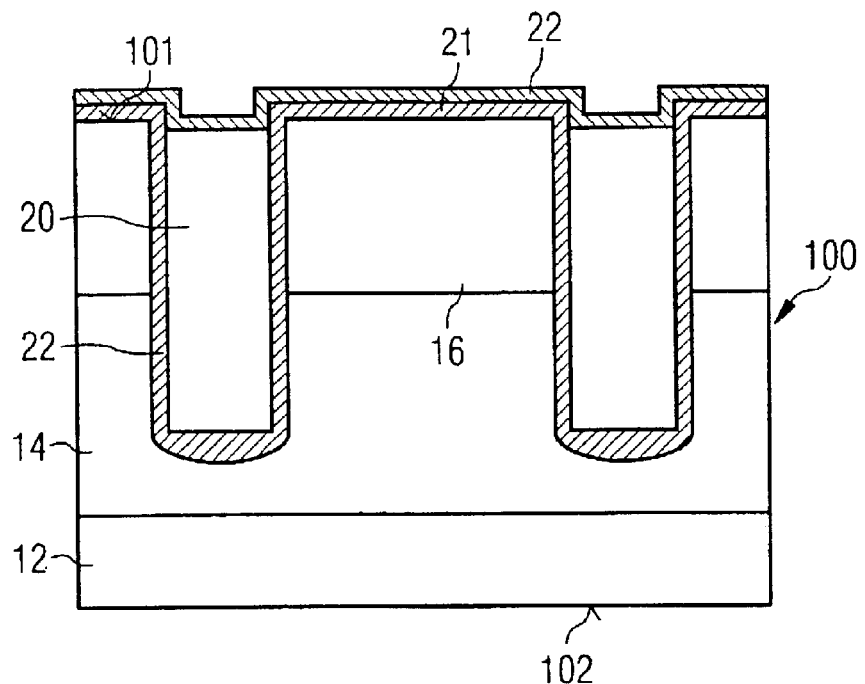
FIG. 3A is a view of a configuration having a semiconductor body, a first terminal zone, a channel zone arranged above the first terminal zone, a control electrode extending in the vertical direction into the semiconductor body and arranged in a trench, and an insulation layer or protective layer applied to the front side.
Figure 3B:
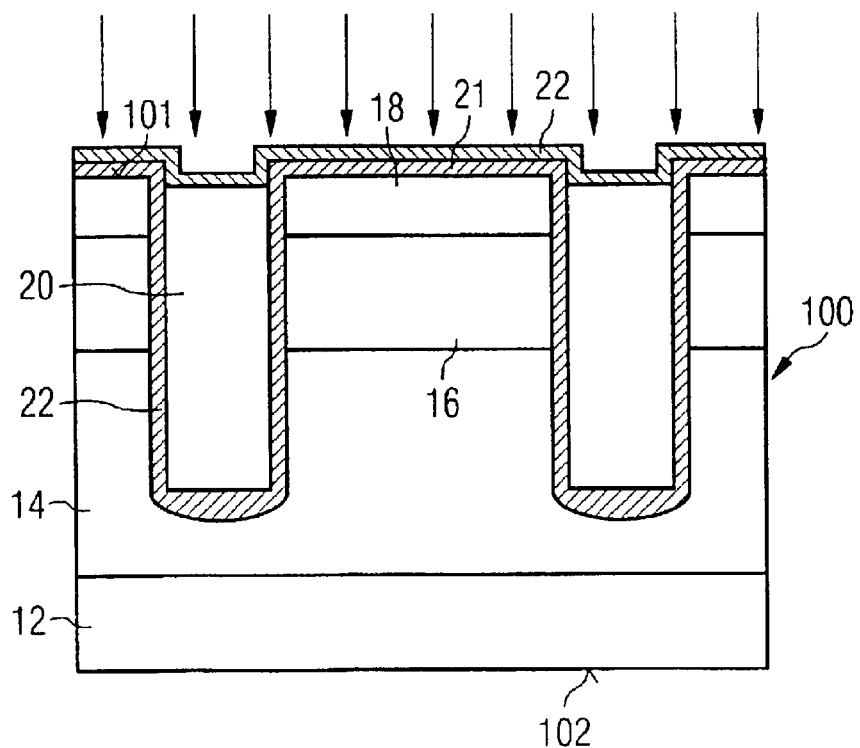
FIG. 3B is a view of the configuration shown in FIG. 3A during a first doping step for fabricating a doped first zone of a second terminal zone.

FIG. 3B is a view of the configuration shown in FIG. 3A during an implantation method in which dopant atoms of the first conduction type are implanted into the body zone 16 in order to form a doped first zone 18, which is part of the later source zone of the MOSFET, in the region of the front side 101 of the semiconductor body. The implantation is effected through the two insulation layers 21, 22.

Figure 3C:
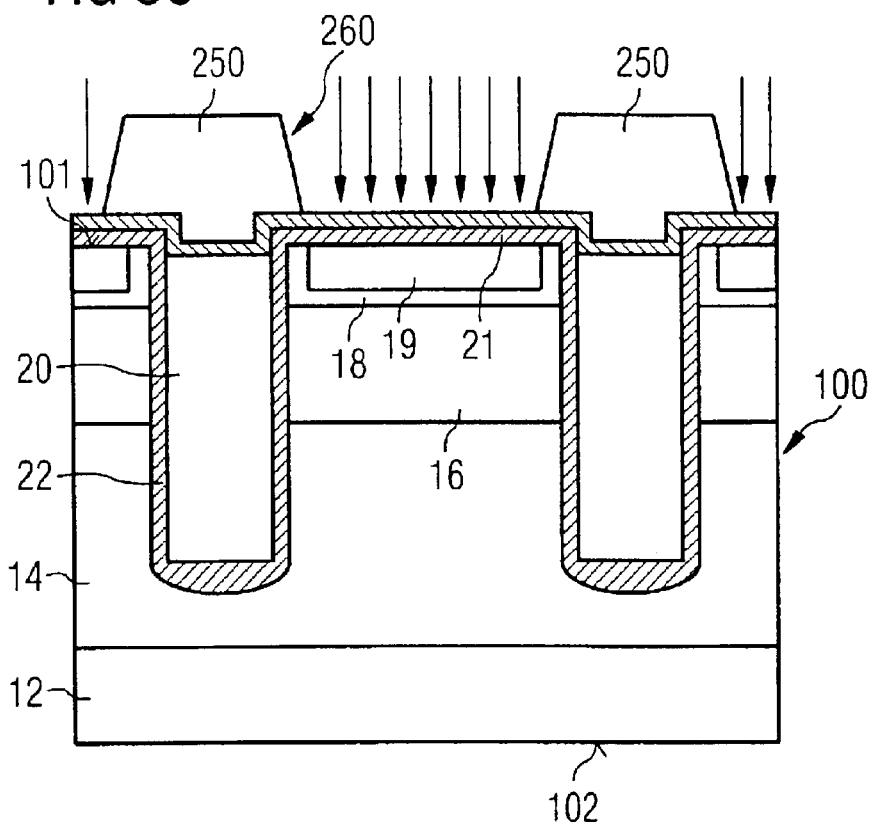
FIG. 3C is a view of the configuration shown in FIG. 3B after the application of a mask and during a second doping step.

FIG. 3C is a view of the configuration shown in FIG. 3B after the application of a mask 250 above the front side 101 of the semiconductor body 100 and during a second implantation method. The mask 250 covers the gate electrode 20 and has a cutout 260 above the first doped zone 18. The cutout 260 is chosen such that, during the second implantation method, dopant atoms for forming a second doped zone 19 are implanted into the semiconductor body 100. The second doped zone 19 is arranged in a manner spaced apart from the insulation layer 21 of the gate electrode 20 in the lateral direction and is doped more heavily than the first doped zone 18.

Figure 3D:
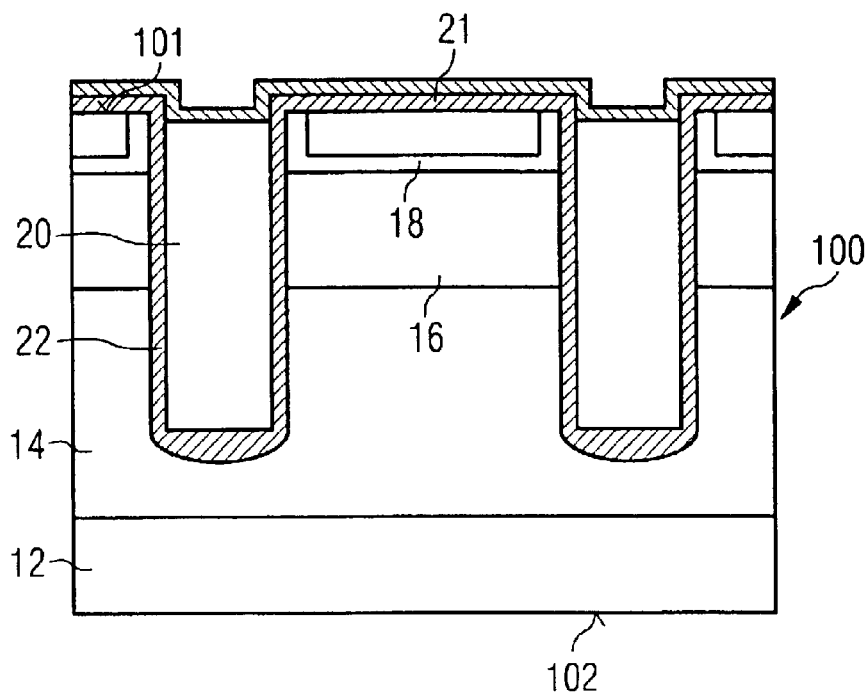
FIG. 3D is a view of the configuration shown in FIG. 3C after the removal of the mask.

FIG. 3D is a view of the configuration shown in FIG. 3C after the removal of the mask 250, which is a resist mask, for example.

Figure 3E:
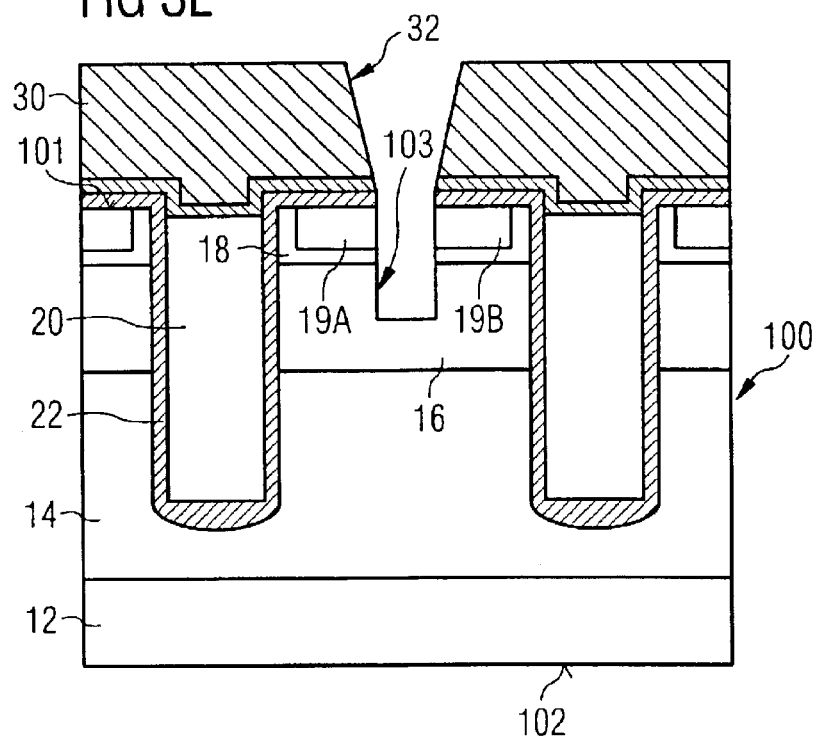
FIG. 3E is a view of the configuration shown in FIG. 3D after the application of an insulation layer above the front side of the semiconductor body and after the fabrication of a contact hole which reaches through the insulation layer down into the channel zone.

FIG. 3E is a view of the configuration shown in FIG. 3D after the fabrication of an insulation layer 30 above the front side 101 of the semiconductor body and after the fabrication of a cutout 32 in the insulation layer 30 and also after the fabrication of a contact hole 103 in the semiconductor body 100 using the insulation layer 30 as a mask. The contact hole 103 extends below the cutout 32 of the insulation layer 30 through the heavily doped second zone, of which zones 19A and 19B remain after the fabrication of the contact hole 103, and through the first zone 18 down into the body zone 16.

Figure 3F:
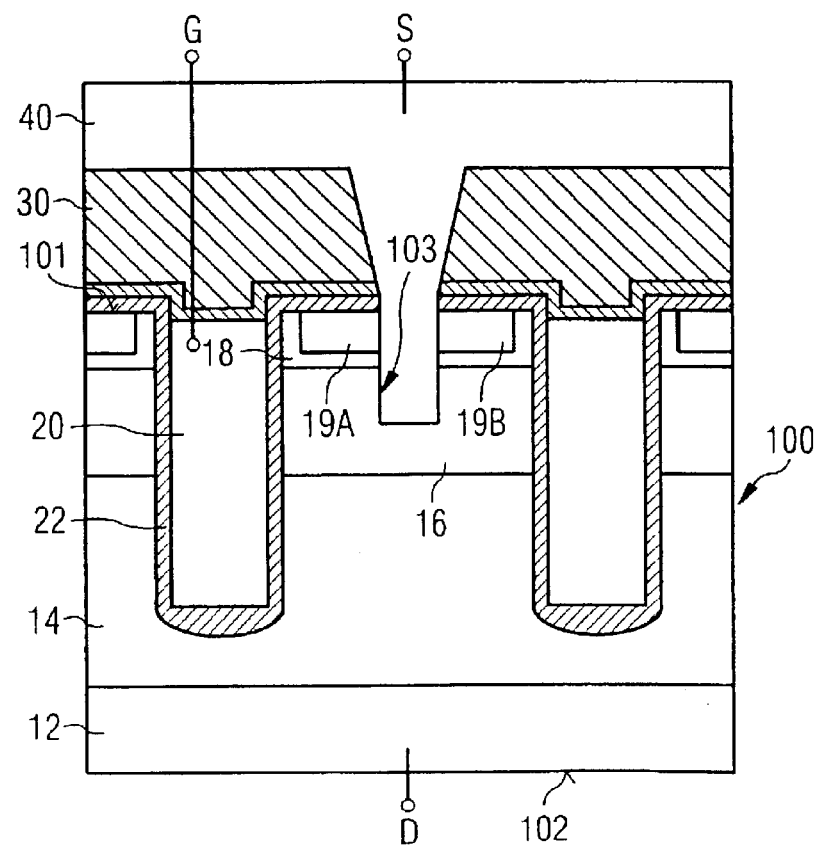
FIG. 3F is a view of the configuration shown in FIG. 3E after the fabrication of a terminal electrode in the contact hole.

Finally, a source electrode 40 is fabricated in the contact hole 103. To that end, as is illustrated in FIG. 3F, an electrode layer is deposited onto the insulation layer 30 and into the contact hole 103.

It goes without saying that, before the fabrication of the source electrode 40, the region of the body zone 16 at the bottom of the contact hole 103 can be heavily doped with dopant atoms of the second conduction type in order to form a low-resistance terminal contact between the source electrode 40 and the body zone 16, as has already been explained with reference to FIG. 1H.

In contrast to the method explained with reference to FIGS. 1A–1H, in the case of the method in accordance with FIGS. 3A–3F, an additional mask is used during the second doping step, or the second implantation method. This mask is removed after the implantation method has been carried out. The use of this mask 250 makes it possible to fabricate a larger-area heavily doped second zone 19 than is possible in the case of the method explained with reference to FIGS. 1A–1H.

In the case of the implantation methods for the two-stage fabrication of the source zone 18, 19 explained with reference to FIGS. 1A to 3F, during the first implantation method, preferably only about 1/20 of the dose which is implanted during the subsequent second implantation method for fabricating the low-resistance contact is implanted.

Besides an implantation method, use may also be made, exclusively or supplementarily, of a diffusion method for fabricating the heavily doped second zone 19, as is explained below with reference to FIGS. 4A–4C.

Figure 4A:
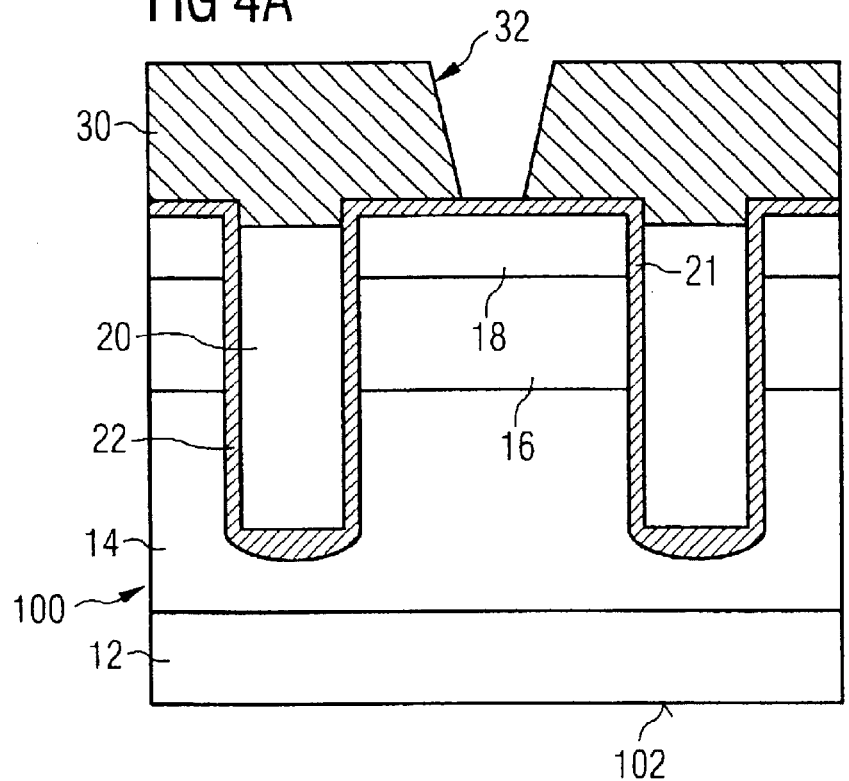
FIG. 4A is a view of a semiconductor configuration during a further method for fabricating a field-effect-controllable semiconductor component.

The starting point of the method is formed, for example, by a configuration in accordance with FIG. 1D, which is illustrated once again in FIG. 4A and has a drain zone 12, a drift zone 14, a body zone 16 above the drift zone 14, and a first doped zone 18 of the first conduction type, which is arranged in the region of the front side 101 of the semiconductor body. The first doped zone 18 forms a part of the later source zone of the MOSFET. The insulation layer 30 is applied above the front side 101 of the semiconductor body. The insulation layer has a cutout 32 and simultaneously serves as a mask for the fabrication of a contact hole in the semiconductor body.

Figure 4B:
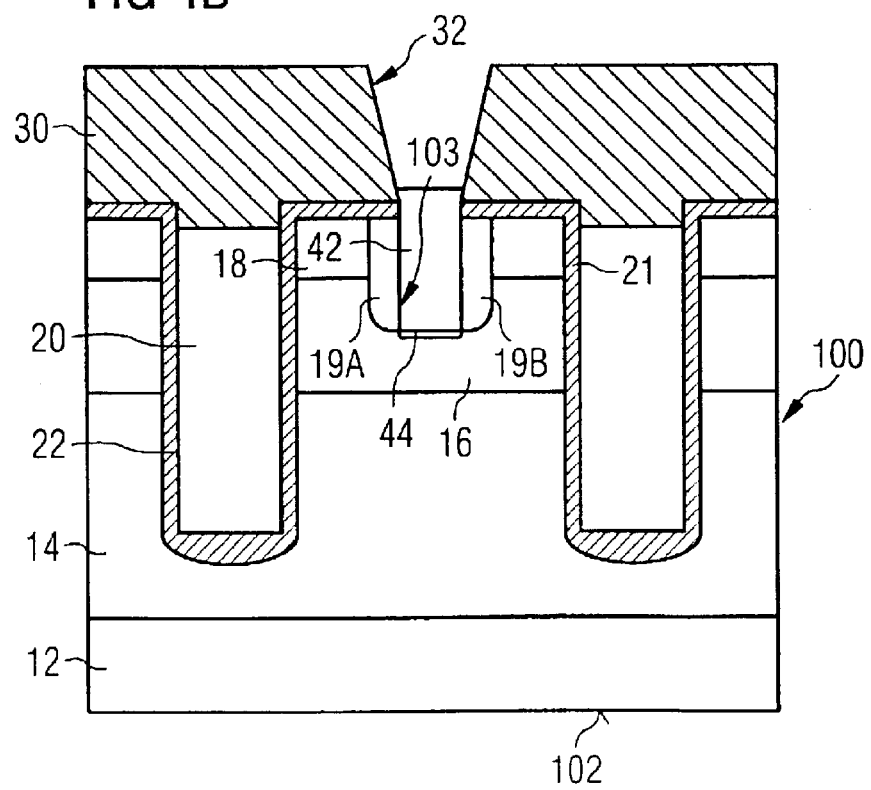
FIG. 4B is a view of the configuration shown in FIG. 4A during a diffusion process, and after fabricating a contact hole and filling the contact hole with a material containing dopant atoms.

FIG. 4B is a view of the configuration shown in FIG. 4A after the fabrication of the contact hole 103 in the semiconductor body. The contact hole extends through the first doped zone 18 down into the body zone 16. In accordance with FIG. 4B, a material containing dopant atoms of the first conduction type, for example, highly doped polysilicon, is introduced into the contact hole in the region of the semiconductor body. The dopant atoms subsequently are outdiffused by a thermal process and form doped zones 19A, 19B in the first doped zone 18 and also the body zone 16. Before the introduction of the layer 42 containing the dopant atoms, a diffusion barrier 44, for example, titanium or a silicide, was introduced at the bottom of the contact hole 103, and prevents a diffusion into regions below the bottom area of the contact hole 103.

Furthermore, it is possible not to drive the contact hole 103 down into the body zone 16, but rather to allow it to end above the body zone 16. In this case, before the introduction of the material 42 containing dopants, below the bottom of the trench, a doped region of the second conduction type is produced which reaches down into the body zone 16 in order to connect the later source electrode formed in the trench to the body zone 16.

Figure 4C:
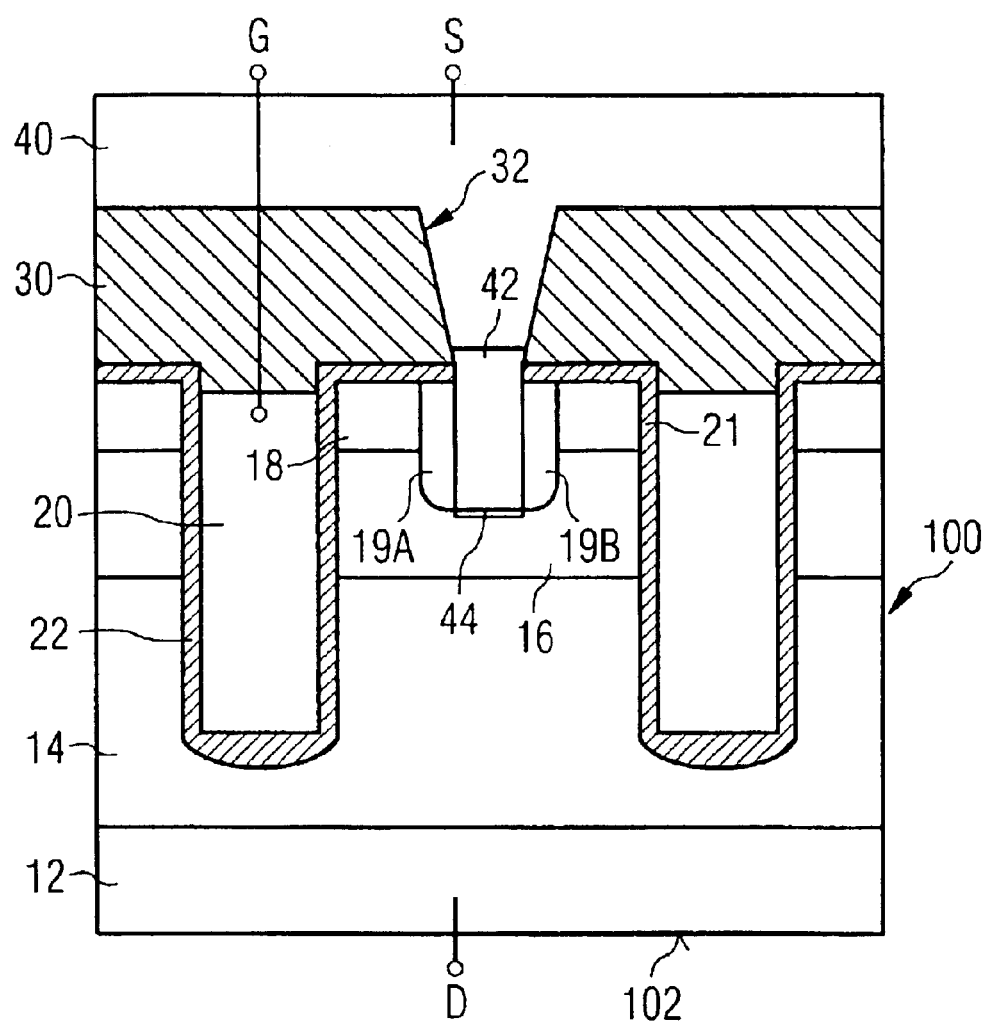
FIG. 4C is a view of the configuration shown in FIG. 4B after fabricating a terminal electrode.

The layer 42 containing the dopant atoms simultaneously forms a part of the later source electrode, as is illustrated in FIG. 4C, where a further electrode material, for example, polysilicon or a metal, has been deposited onto the material 42 in order to form the source electrode.

A modification of the method in accordance with FIGS. 4A–4C which is not specifically illustrated provides for the contact hole first to be driven only down into the first doped zone 18, so that the contact hole ends above the body zone 16. The contact hole is subsequently filled e.g. with a material containing dopant atoms. The dopant atoms subsequently outdiffuse in order to form the heavily doped zone in the first doped zone 18. In this method, the material containing the dopant atoms does not form part of the source electrode, but rather is removed during a subsequent method step in which the contact hole is driven down into the body zone 16, the diffusion zones adjacent to the contact hole remaining. In this embodiment of the method, the material containing the dopant atoms may be an arsenic glass, for example, if an n-type doping is to be achieved.

As an alternative, it is possible to drive the contact hole down into the body zone from the outset and to apply, to the side wall of the contact hole, a material containing dopant atoms of the first conduction type, for example, an arsenic glass for an n-type doping. This material is removed, for example, by a spacer etching, from the bottom of the contact hole in the body zone 16. Afterward, a material containing dopant atoms of the second conduction type is applied to the bottom of the contact hole. This material is boron glass, for example, for a p-type doping and is isolated from the first material by an undoped oxide, for example. In a subsequent thermal process, charge carriers of the first conduction type outdiffuse into the side walls in order to form a heavily doped second zone 19 for the source terminal contact. At the same time, charge carriers of the second conduction type outdiffuse into the bottom of the contact hole into the body zone 16, in order to form a low-resistance body terminal contact.

Afterward, after the removal of the dopant materials, in this method, too, a terminal electrode is formed in the contact hole reaching down into the body zone. The heavily doped region of the source zone that has previously been formed by the diffusion forms a low-resistance terminal contact with the terminal electrode.

What is essential to the method is the two-stage fabrication of the source zone with a more weakly doped first zone fabricated first and a more heavily doped second zone fabricated afterward. It goes without saying that implantation methods and diffusion methods can also be combined in this case.

Thus, in a modification of the method illustrated in FIGS. 1A–1H, the implantation for fabricating the second zone 18 is performed into the cutout 32 perpendicularly to the surface and drives the doped region under the edges of the contact hole 32 by using a thermal step.

As already explained, the inventive method is in no way limited to the fabrication of vertical transistors. It goes without saying that the fabrication of a low-resistance source contact in accordance with the inventive method can also be applied to planar DMOS (Double Diffused Metal Oxide Semiconductor) transistors, to drain-up transistors, to IGBTs (Insulated Gate Bipolar Transistors) and further types of normally on or normally off transistors, p- and n-channel transistors.

We claim:

1. A method for fabricating a field-effect-controllable semiconductor component, the method which comprises:
providing a configuration having a semiconductor body with a front side, a rear side, a first terminal zone of a first conduction type, a channel zone of a second conduction type formed above the first terminal zone, and at least one control electrode adjacent the channel zone, the control electrode being insulated from the semiconductor body; and fabricating a second terminal zone of the first conduction type in the channel zone near the front side of the semiconductor body by:

doping the channel zone near the front side with a first dopant concentration to fabricate a first zone of the first conduction type, and doping a section of the first zone with a second dopant concentration higher than the first dopant concentration to form a second zone of the first conduction type.

2. The method according to claim 1, which further comprises, before performing the step of doping the section of the first zone, producing a mask above the front side of the semiconductor body such that the mask has a cutout above the first doped zone and covers the control electrode.

3. The method according to claim 2, which further comprises:

providing the mask as an insulation layer wherein the cutout is formed in the insulation layer and is located above the channel zone; and after performing the step of doping the section of the first zone, leaving the mask on the semiconductor body.

4. The method according to claim 3, which further comprises performing the step of doping the section of the first zone to produce a heavily doped zone of the first conduction type in the first zone below edges of the cutout.

5. The method according to claim 4, which further comprises performing the step of doping the section of the first zone by carrying out an implantation method in which implantation is effected at a first angle and at a second angle with respect to a normal to the semiconductor body.

6. The method according to claim 5, which further comprises, before performing the implantation method, producing a trench only reaching down into the first zone.

7. The method according to claim 3, which further comprises:

providing a thin first insulation layer on the front side of the semiconductor body; and providing the insulation layer on the thin first insulation layer.

8. The method according to claim 7, which further comprises:

forming the cutout through the insulation layer to the first insulation layer on the front side of the semiconductor body; and performing the implantation method through the first insulation layer into the first terminal zone.

9. The method according to claim 1, which further comprises:

before performing the step of doping the section of the first zone, producing a mask above the front side of the semiconductor body such that the mask has a cutout above the first doped zone and covers the control electrode; and after performing the step of doping the section of the first zone, removing the mask.

10. The method according to claim 9, wherein the mask is a photomask.

11. The method according to claim 1, which further comprises:

fabricating a contact hole reaching from the front side of the semiconductor body through the first terminal zone and down into the channel zone; and fabricating a terminal electrode in the contact hole.

12. The method according to claim 11, which further comprises:

before performing the step of doping the section of the first zone, producing a mask above the front side of the semiconductor body such that the mask has a cutout above the first doped zone and covers the control electrode;

providing the mask as an insulation layer wherein the cutout is formed in the insulation layer and is located above the channel zone;

after performing the step of doping the section of the first zone, leaving the mask on the semiconductor body; and when performing the step of fabricating the contact hole, using the insulation layer having the cutout as a mask.

13. The method according to claim 12, wherein the step of fabricating the terminal electrode includes depositing an electrode layer onto the insulation layer and into the contact hole.

14. The method according to claim 11, which further comprises, after performing the step of fabricating the contact hole, producing a heavily doped zone of the second conduction type in the channel zone at a bottom of the contact hole.

15. The method according to claim 14, which further comprises performing the step of producing the heavily doped zone by carrying out an implantation method at an angle of 0° with respect to a normal to the semiconductor body.

16. The method according to claim 11, which further comprises performing the step of fabricating the contact hole using an anisotropic etching method.

17. The method according to claim 11, which further comprises:

using an implantation method to perform the step of fabricating the contact hole; and using an implantation method to perform the step of doping the channel zone with a dose of about $\frac{1}{20}$ of that used during the step of fabricating the contact hole.

18. The method according to claim 1, which further comprises:

before performing the step of doping the section of the first zone, producing a mask above the front side of the semiconductor body such that the mask has a cutout above the first doped zone and covers the control electrode; and before performing the step of doping the section of the first zone, producing a trench in the first zone, filling the trench with a material containing dopant atoms, and subsequently driving out the dopant atoms using a diffusion method.

19. The method according to claim 18, which further comprises:

performing the step of producing the trench such that the trench reaches down into the channel zone and serves as a contact hole; and applying a diffusion barrier to a bottom of the contact hole.

20. The method according to claim 19, which further comprises fabricating an electrode in the contact hole.

21. The method according to claim 20, wherein the material containing the dopant atoms forms a part of the electrode.

22. The method according to claim 21, wherein the material containing the dopant atoms is highly doped polysilicon.

23. The method according to claim 18, wherein the material containing the dopant atoms is an arsenic glass.

24. A field-effect-controllable semiconductor component, comprising:
   a first terminal zone of a first conduction type;
   a second terminal zone of a first conduction type;
   a channel zone of a second conduction type, said channel zone configured between said first terminal zone and said second terminal zone;
   a control electrode configured adjacent said channel zone and being insulated from said channel zone; and
   a terminal electrode connected at least to said second terminal zone;
   said second terminal zone having a doped first zone and a zone connected to said terminal electrode; and
   said zone being doped more heavily than said first zone.

* * * * *

UNITED STATES PATENT AND TRADEMARK OFFICE
CERTIFICATE OF CORRECTION

| | | |
|---|---|---|
| PATENT NO. | : 6,927,101 B2 | Page 1 of 1 |
| APPLICATION NO. | : 10/402812 | |
| DATED | : August 9, 2005 | |
| INVENTOR(S) | : Ralf Henninger et al. | |

It is certified that error appears in the above-identified patent and that said Letters Patent is hereby corrected as shown below:

Col. 14, lines 1-6; in the Claims, should read:

11. The method according to claim 1, which further comprises: fabricating a contact hole reaching from the front side of the semiconductor body through the <u>second</u> terminal zone and down into the channel zone; and fabricating a terminal electrode in the contact hole.

Signed and Sealed this

First Day of June, 2010

David J. Kappos
*Director of the United States Patent and Trademark Office*